United States Patent
Cheng et al.

(10) Patent No.: US 8,232,210 B2
(45) Date of Patent: Jul. 31, 2012

(54) DOUBLE PATTERNING PROCESS FOR INTEGRATED CIRCUIT DEVICE MANUFACTURING

(75) Inventors: Kangguo Cheng, Albany, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 524 days.

(21) Appl. No.: 12/562,222

(22) Filed: Sep. 18, 2009

(65) Prior Publication Data

US 2011/0070739 A1    Mar. 24, 2011

(51) Int. Cl.
*H01L 21/311* (2006.01)
(52) U.S. Cl. ........ 438/694; 438/703; 438/717; 438/736; 438/E21.219; 430/312; 430/322; 430/270.1
(58) Field of Classification Search .......... 438/702–703, 438/698, 717; 437/735–736, 689; 430/5, 430/312, 314, 322, 324, 207.1; 216/41, 47; 215/58
See application file for complete search history.

(56) References Cited

U.S. PATENT DOCUMENTS

| | | | |
|---|---|---|---|
| 7,601,647 B2 * | 10/2009 | Jeon et al. | 438/717 |
| 7,935,635 B2 * | 5/2011 | Jeon et al. | 438/689 |
| 2008/0220611 A1 | 9/2008 | Jeon et al. | |
| 2009/0004575 A1 | 1/2009 | Kim | |
| 2009/0061362 A1 | 3/2009 | Taoka et al. | |

* cited by examiner

*Primary Examiner* — Dung A. Le
(74) *Attorney, Agent, or Firm* — Cantor Colburn LLP; Wenjie Li

(57) ABSTRACT

A method of forming an integrated circuit (IC) device feature includes forming an initially substantially planar hardmask layer over a semiconductor device layer to be patterned; forming a first photoresist layer over the hardmask layer; patterning a first set of semiconductor device features in the first photoresist layer; registering the first set of semiconductor device features in the hardmask layer in a manner that maintains the hardmask layer substantially planar; removing the first photoresist layer; forming a second photoresist layer over the substantially planar hardmask layer; patterning a second set of semiconductor device features in the second photoresist layer; registering the second set of semiconductor device features in the hardmask layer in a manner that maintains the hardmask layer substantially planar; removing the second photoresist layer; and creating topography within the hardmask layer by removing portions thereof corresponding to both the first and second sets of semiconductor device features.

14 Claims, 19 Drawing Sheets

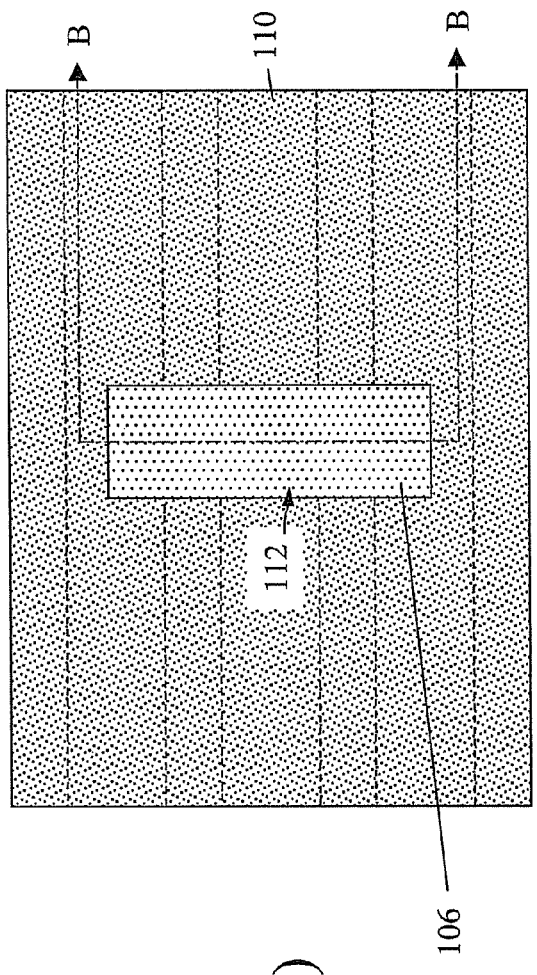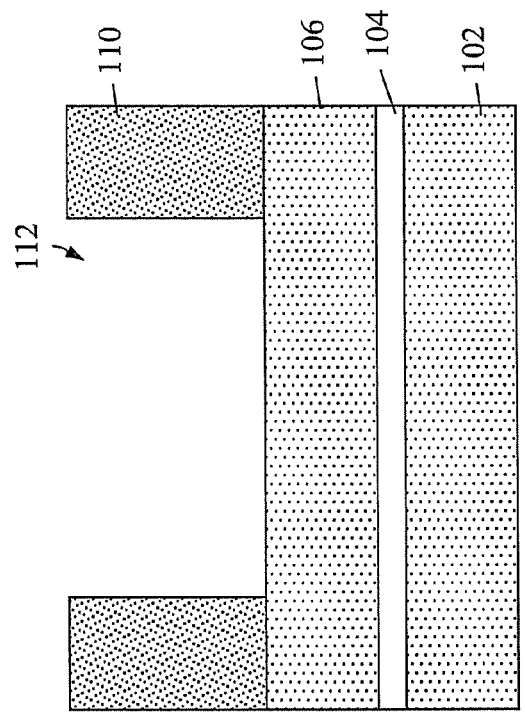
Fig. 3(a)
(Prior Art)
Fig. 3(b)
(Prior Art)

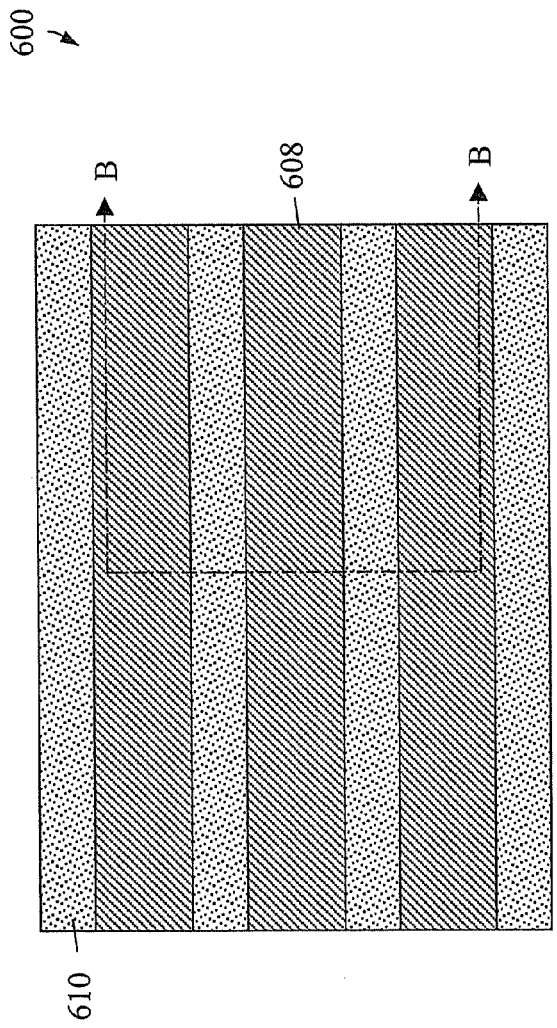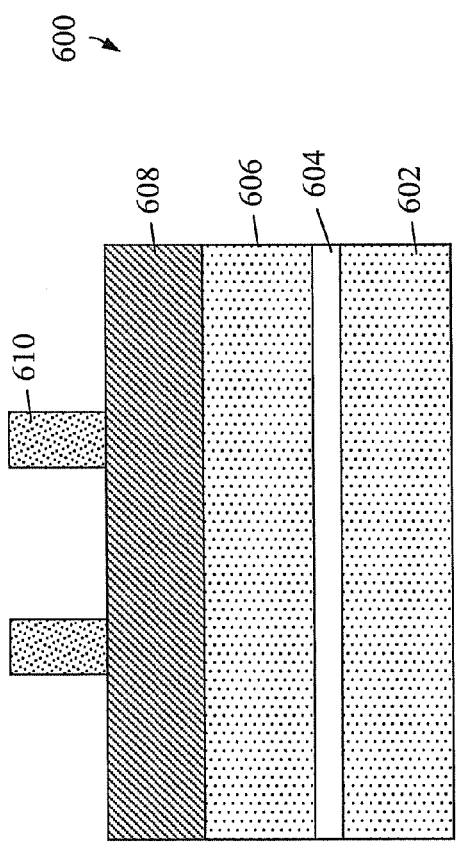
Fig. 6(a)
Fig. 6(b)

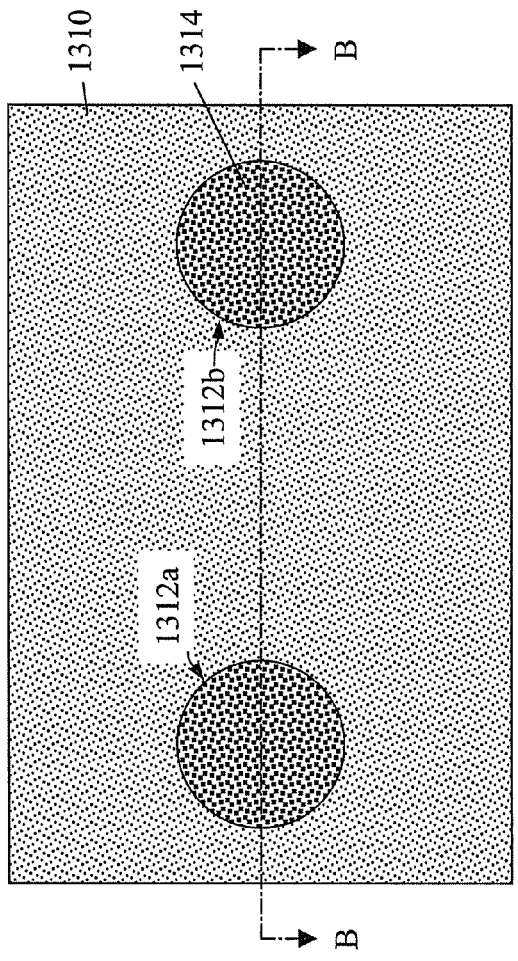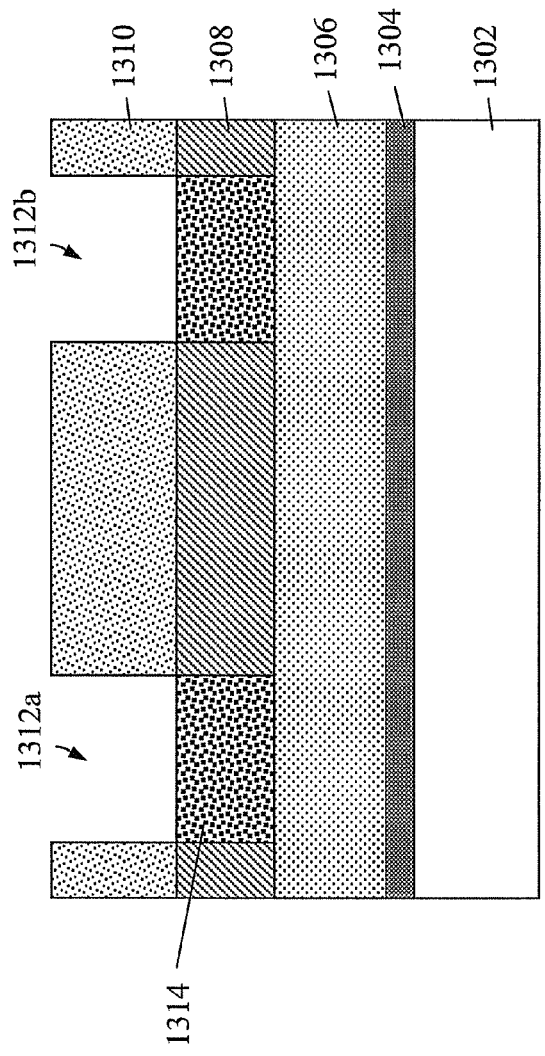
Fig. 14(a)
Fig. 14(b)

US 8,232,210 B2

DOUBLE PATTERNING PROCESS FOR INTEGRATED CIRCUIT DEVICE MANUFACTURING

BACKGROUND

The present invention relates generally to semiconductor device manufacturing techniques and, more particularly, to an improved double patterning process for integrated circuit (IC) device manufacturing.

Double exposure, double etch patterning has been adopted in 32 nanometer (nm) node to improve pattern density at critical levels. Double patterning is a process for obtaining designed layout patterns, by distributing layout patterns into a plurality of masks and performing a plurality of exposure processes, etching processes and the like. When the distance between two layout patterns is small, if the two layout patterns are formed on an identical mask, the two layout patterns cannot separately be formed on a wafer. Double patterning is therefore used to avoid such a problem.

More specifically, a first exposure of photoresist is used to transfer a first pattern to an underlying hardmask layer by etching. After the photoresist is removed following the hardmask pattern transfer, a second layer of photoresist is then coated onto the once-etched hardmask layer. This second photoresist layer undergoes a second exposure, imaging additional features (by etching) in between the features already patterned in the hardmask layer. The resulting surface pattern of first and second features in the patterned hardmask can then be transferred into a layer beneath the hardmask, such as a dielectric layer or a gate electrode layer, for example. This effectively allows for a doubling of feature density.

However, there are issues related to the double patterning technique. In particular, one obstacle relates to the topography formed in a layer (e.g., a hardmask) as a result of the first patterning and etch process. The resulting topography from a first patterning process reduces the lithography process window for the second patterning process. This is especially a problem for high numerical aperture (NA) lithography due to its extremely shallow depth of focus.

SUMMARY

In an exemplary embodiment, a method of forming an integrated circuit (IC) device feature includes forming an initially substantially planar hardmask layer over a semiconductor device layer to be patterned; forming a first photoresist layer over the initially substantially planar hardmask layer, and patterning a first set of semiconductor device features in the first photoresist layer; registering the first set of semiconductor device features in the hardmask layer in a manner that maintains the hardmask layer substantially planar; removing the first photoresist layer; forming a second photoresist layer over the substantially planar hardmask layer, and patterning a second set of semiconductor device features in the second photoresist layer; registering the second set of semiconductor device features in the hardmask layer in a manner that maintains the hardmask layer substantially planar; removing the second photoresist layer; and creating topography within the hardmask layer by removing portions thereof corresponding to both the first and second sets of semiconductor device features.

In another embodiment, a method of forming an integrated circuit (IC) device feature includes forming an initially substantially planar hardmask layer over a semiconductor device layer to be patterned; forming a first photoresist layer over the initially substantially planar hardmask layer, and patterning a first set of semiconductor device features in the first photoresist layer; registering the first set of semiconductor device features in the hardmask layer in a manner that maintains the hardmask layer substantially planar; removing the first photoresist layer; forming a second photoresist layer over the substantially planar hardmask layer, and patterning a second set of semiconductor device features in the second photoresist layer; registering the second set of semiconductor device features in the hardmask layer in a manner that maintains the hardmask layer substantially planar; removing the second photoresist layer; creating topography within the hardmask layer by removing portions thereof corresponding to both the first and second sets of semiconductor device features; and transferring a resulting combined pattern formed in the hardmask layer into the semiconductor device layer therebeneath.

BRIEF DESCRIPTION OF THE SEVERAL VIEWS OF THE DRAWINGS

Referring to the exemplary drawings wherein like elements are numbered alike in the several Figures:

FIGS. 1 through 5 are a series of various top and cross sectional views illustrating an existing method of double patterning in semiconductor device manufacturing;

FIGS. 6 through 12 are a series of various top and cross sectional views illustrating a method of double patterning in semiconductor device manufacturing, in accordance with an embodiment of the invention;

FIGS. 13 through 18 are a series of various top and cross sectional views illustrating a method of double patterning in semiconductor device manufacturing, in accordance with another embodiment of the invention.

DETAILED DESCRIPTION

Disclosed herein an improved double patterning process for integrated circuit (IC) device manufacturing that avoids creating topography in a hardmask after a first patterning operation. In so doing, the lithographic process window of the second patterning process is improved. Once both lithography patterns are defined, the resulting final double density pattern is then actually transferred into the hardmask layer through a single etch. In an exemplary embodiment, the first and second (or more) patterns are "registered" or recorded in the hardmask layer in a non-topographic fashion by implantation of a dopant species (such as germanium, for example), which creates an etch selectivity in the hardmask layer (e.g., a nitride material). In this manner, the hardmask layer is not etched to create topography therein until multiple lithographic patterns have been defined therein through dopant implantation.

Figure 1A:
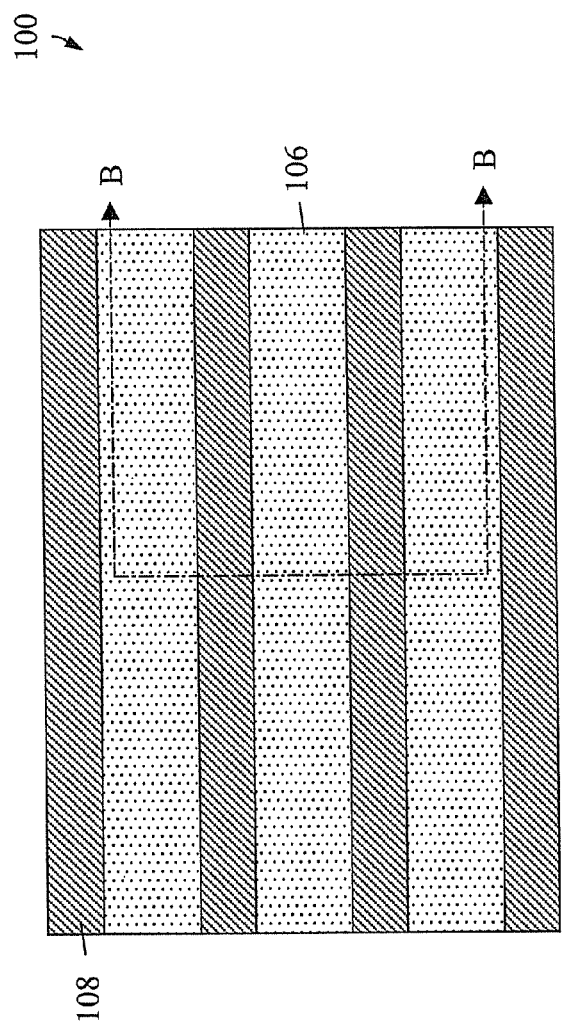
Figure 1B:
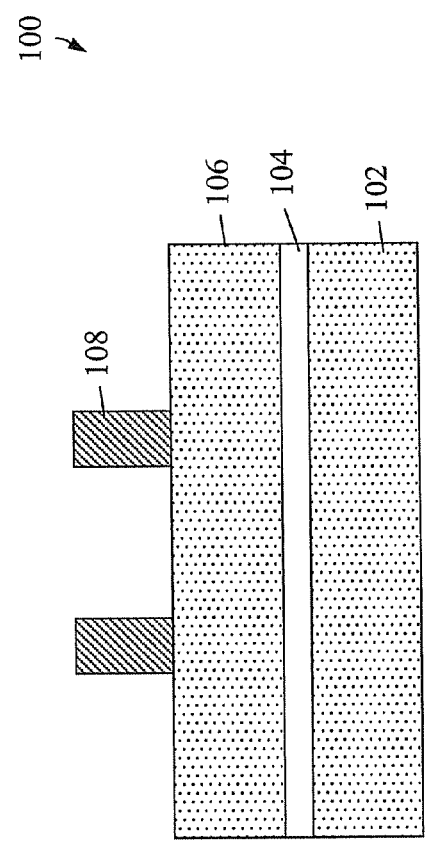

Referring initially to FIGS. 1 through 5, there is shown are a series of top and cross sectional views illustrating an existing method of double patterning in semiconductor device manufacturing. In the Figures, the "(a)" suffix generally denotes a top view, while the "(b)" and "(c)" suffixes generally denote cross sectional views taken along lines of the top view. Beginning with FIG. 1, FIG. 1(a) is a top view of a semiconductor device 100 that is being patterned for transistor gate formation, while FIG. 1(b) is a cross sectional view taken along the lines B-B of FIG. 1(a). As is particularly shown in FIG. 1(b), a semiconductor substrate 102 (e.g., silicon, silicon-on-insulator, etc.) has a gate dielectric layer 104 (e.g., oxide, nitride, oxynitride, etc.) formed thereon, followed by a gate conductor layer 106 (e.g., polysilicon). A hardmask layer 108 (e.g., silicon nitride) is patterned in accordance with a first lithographic process as known in the art to define a first pattern that, in this example, is a plurality of gate conductors.

Figure 2A:
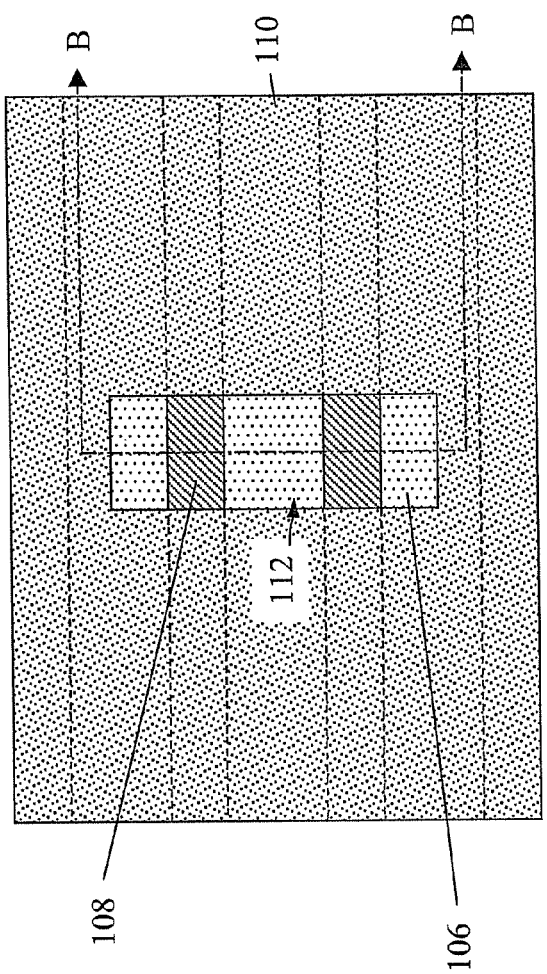
Figure 2B:
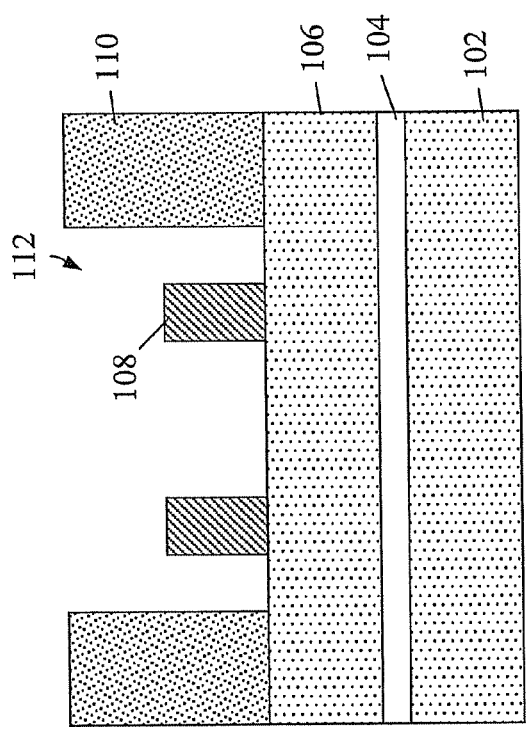
Figure 4A:
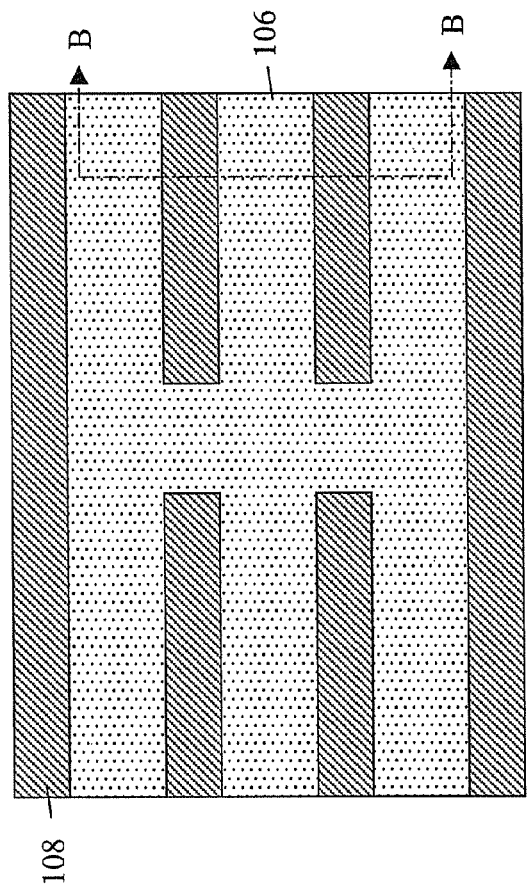
Figure 4B:
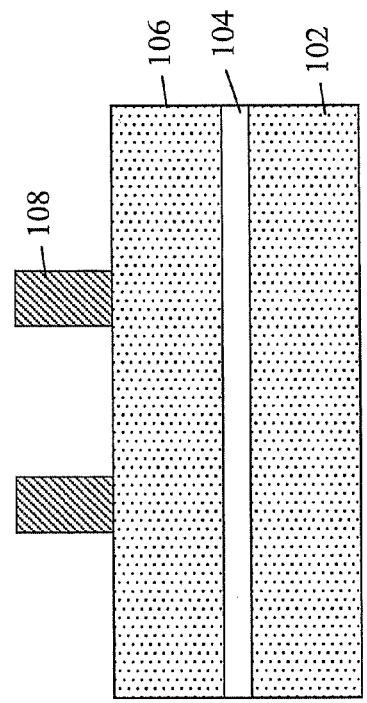
Figure 5A:
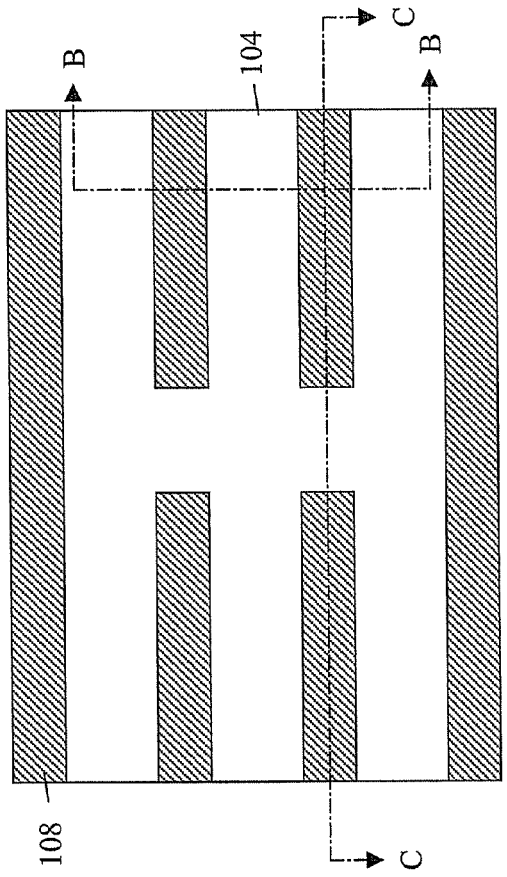
Figure 5C:
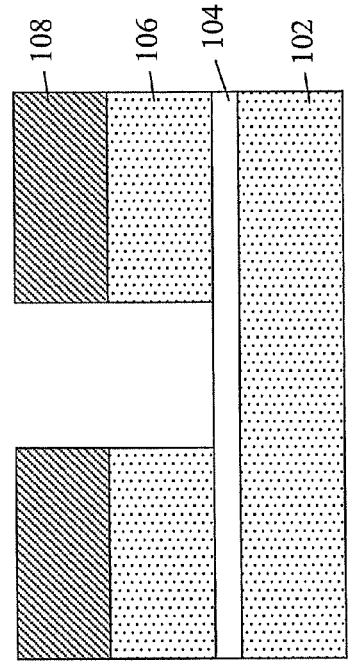
Figure 5B:
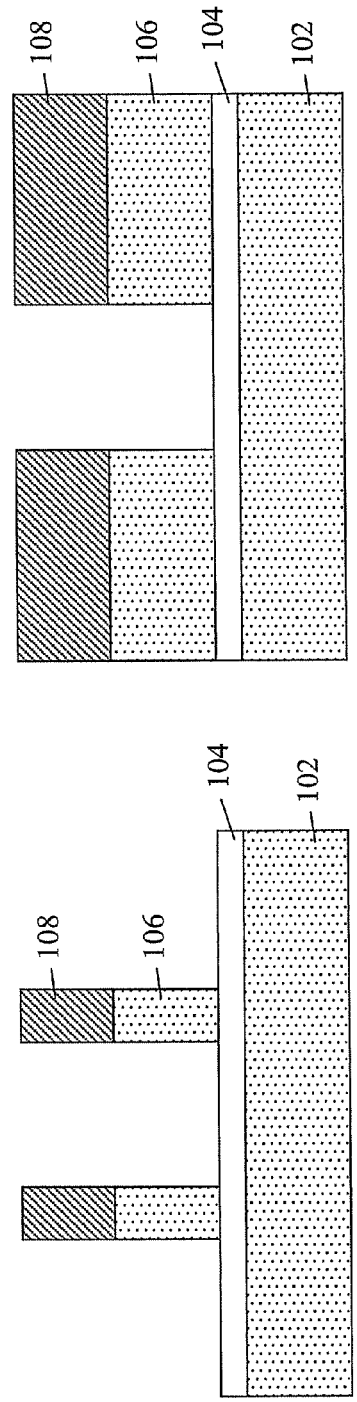

As then shown in FIGS. 2(a) and 2(b), a second lithographic process is used to create a second pattern, wherein a (second) photoresist layer 110 is formed over the device (including the topographic, once patterned hardmask layer 108) and patterned so as to form an opening 112 therein. The opening 112 in the resist layer 110 defines a location in which a pair of the subsequently formed gate lines are to be broken. As shown in FIGS. 3(a) and 3(b), the exposed portions of the nitride hardmask layer 108 are then removed, such as by reactive ion etching (RIE). Then, the resist layer 110 is removed as shown in FIGS. 4(a) and 4(b), thereby revealing the completed double patterned hardmask layer 108. Finally, in FIGS. 5(a), 5(b) and 5(c), the double pattern of the hardmask layer 108 is transferred into the gate conductor layer 106 through another etch process, stopping on the gate dielectric layer 104. From this point, standard CMOS device process may continue.

As mentioned above, however, during the second patterning of the hardmask layer 108, the formation of the resist layer 110 on the topographic features of the once patterned hardmask layer 108 (FIG. 2) creates problems in terms of the diminished process window. That is, patterning a resist layer with features at or below the critical dimension on a topographic surface is problematic given a smaller depth of focus and the potential for scumming (resist residue left on the wafer).

Accordingly, FIGS. 6 through 12 are a series of various top and cross sectional views illustrating a method of double patterning in semiconductor device manufacturing, in accordance with an embodiment of the invention. The technique of this embodiment is again presented in the context of gate conductor formation, but as will be shown later, it is equally applicable to formation of other device features in semiconductor manufacturing. Beginning with FIGS. 6(a) and 6(b), a semiconductor device 600 includes a semiconductor substrate 602, a gate dielectric layer 604 formed on the substrate 602, a gate conductor layer 606 formed on the gate dielectric layer 604, and a hardmask layer 608 formed on the gate conductor layer 606. As also shown, a first photoresist layer 610 formed on the hardmask layer 608 is patterned with a first set of features.

Figure 7A:
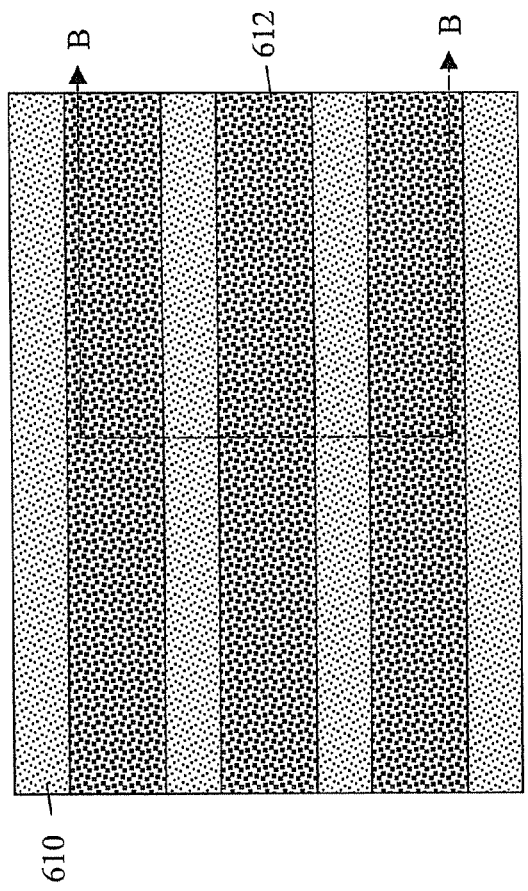
Figure 7B:
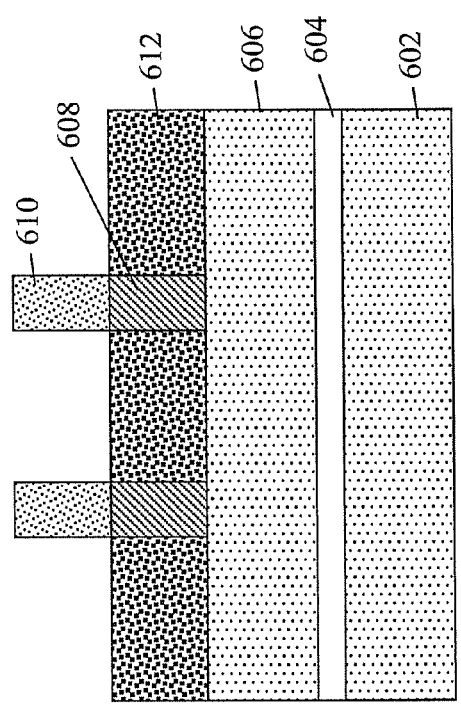

In a conventional double patterning process, the resist pattern would, at this point, be etched into the hardmask layer 608 before a second patterning process takes place. However, as shown in FIGS. 7(a) and 7(b), the device is instead subjected to a dopant implant (e.g., a neutral species such as germanium) so as to create doped regions 612 within the hardmask layer 608 (e.g., nitride) that are etch selective with respect to undoped portions thereof. In addition to germanium, other dopant materials may also be used, including but not limited to, silicon, argon, xenon, and arsenic. In this manner, the first pattern is effectively registered or stored within the hardmask layer 608 in a manner that does not create topography prior to completion of all desired patterns. Once the first pattern is registered, the first resist layer 610 is then removed.

Figure 8A:
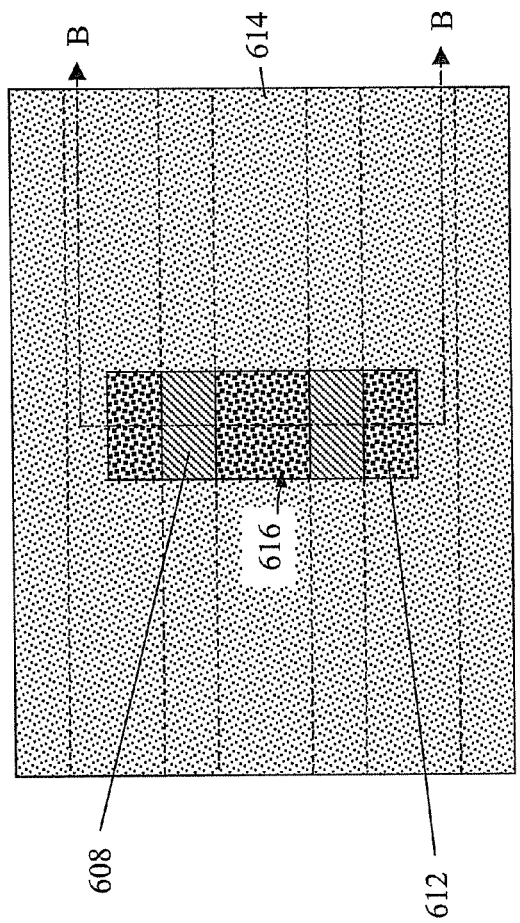
Figure 8B:
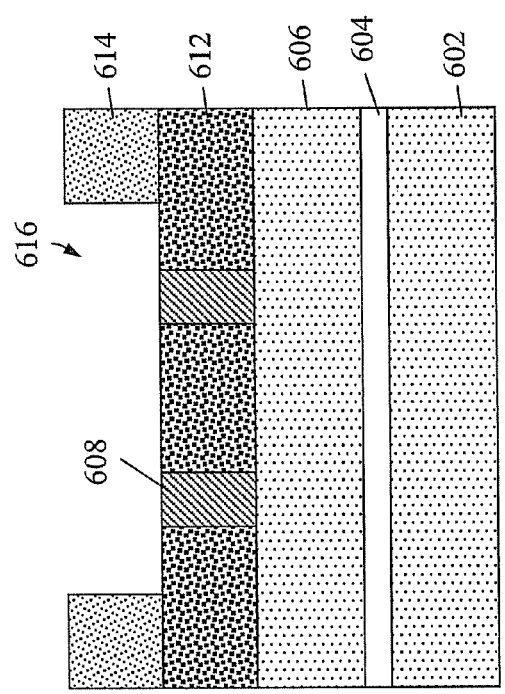
Figure 9A:
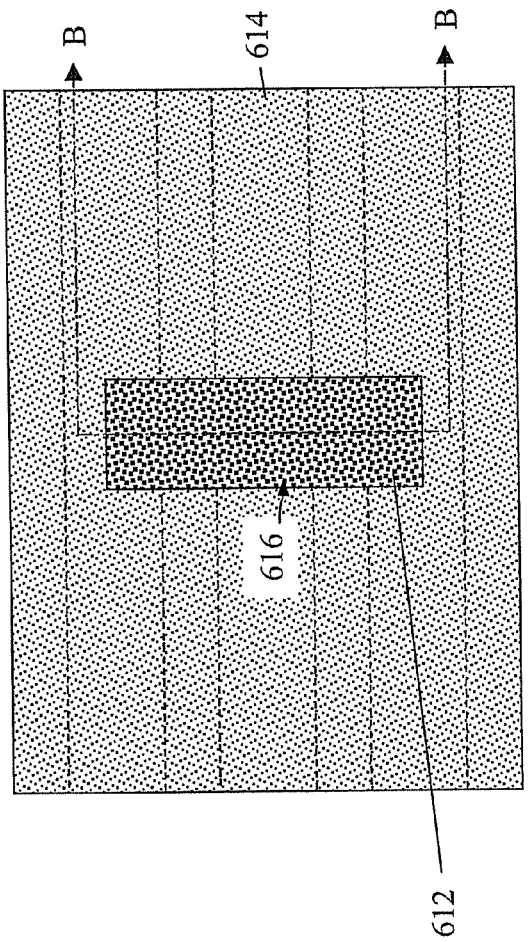
Figure 9B:
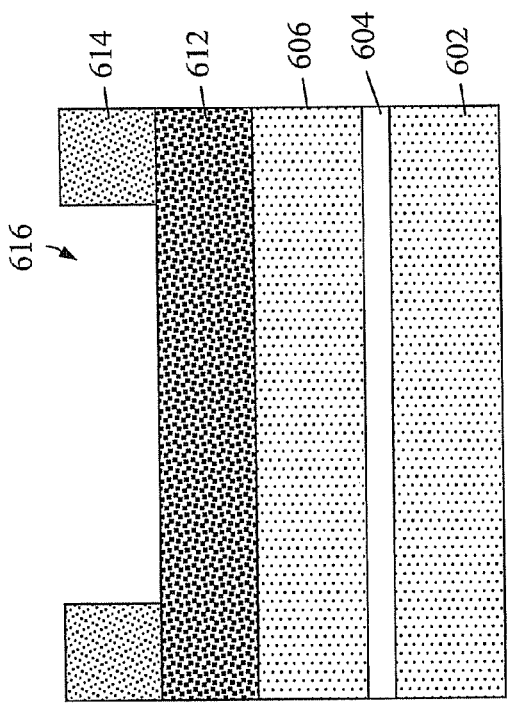

As shown in FIGS. 8(a) and 8(b), a second photoresist layer 614 is then formed over the substantially planar, non-topographic hardmask layer 608 with doped regions 612. The resist layer 614 is then patterned and opened to form an opening 616 (similar to that in FIG. 2(a)) for the purpose of creating a break in the subsequently gate lines, and the dimensions of which are difficult to create in a single pattern process. Then, a second dopant implant is performed so as to register this second pattern within the newly exposed portions of the planar hardmask layer 608, as shown in FIGS. 9(a) and 9(b). In other words, the entire portion of the hardmask layer exposed by opening 616 is now a doped region 612.

Figure 10A:
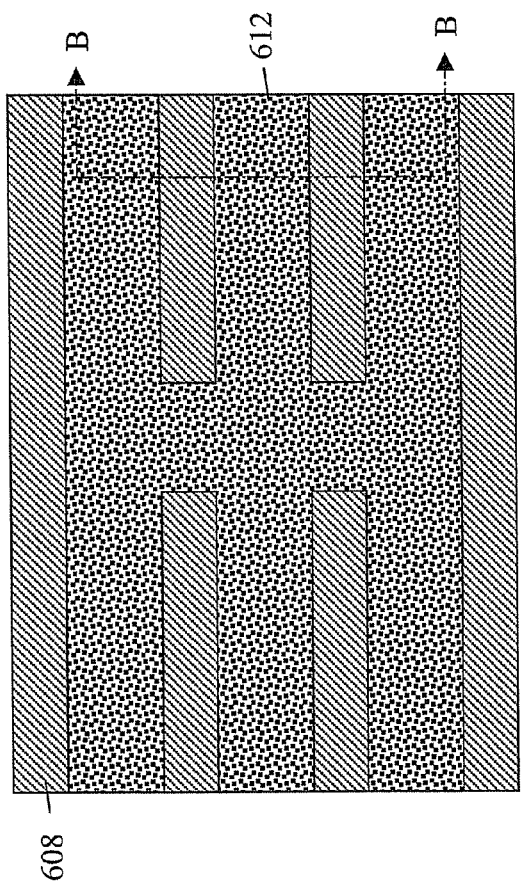
Figure 10B:
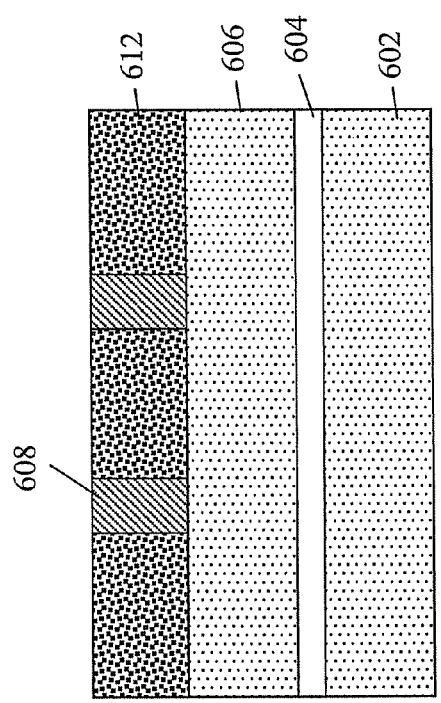
Figure 11A:
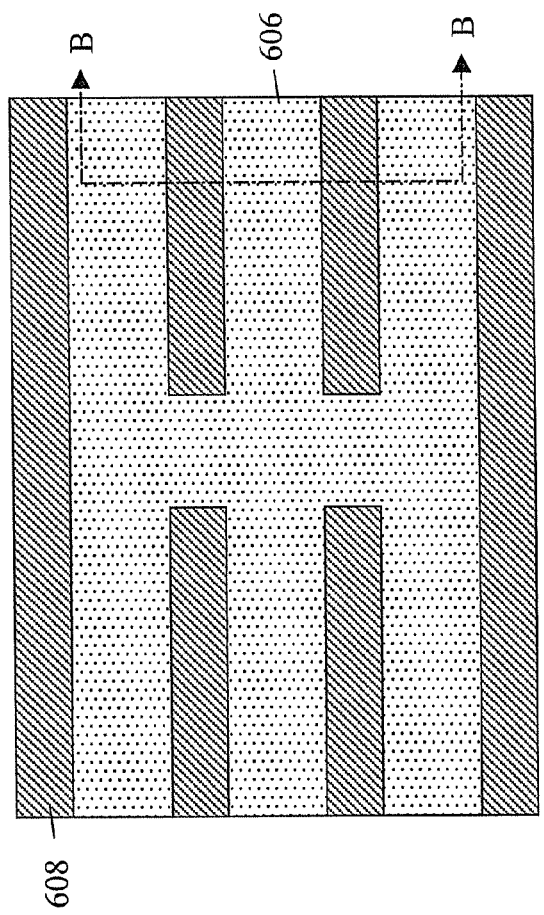
Figure 11B:
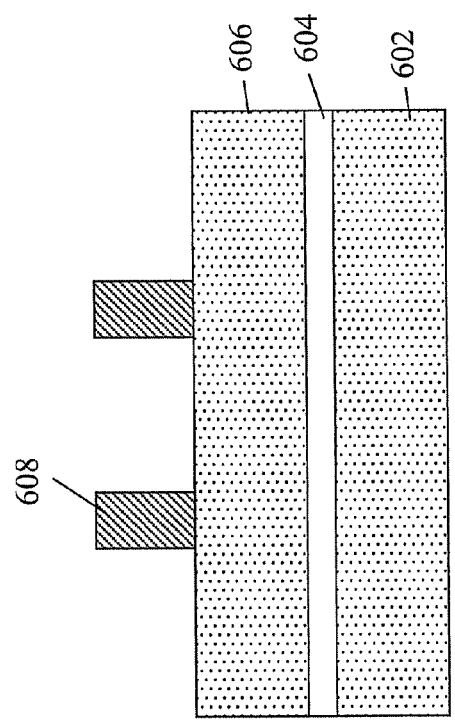
Figure 12A:
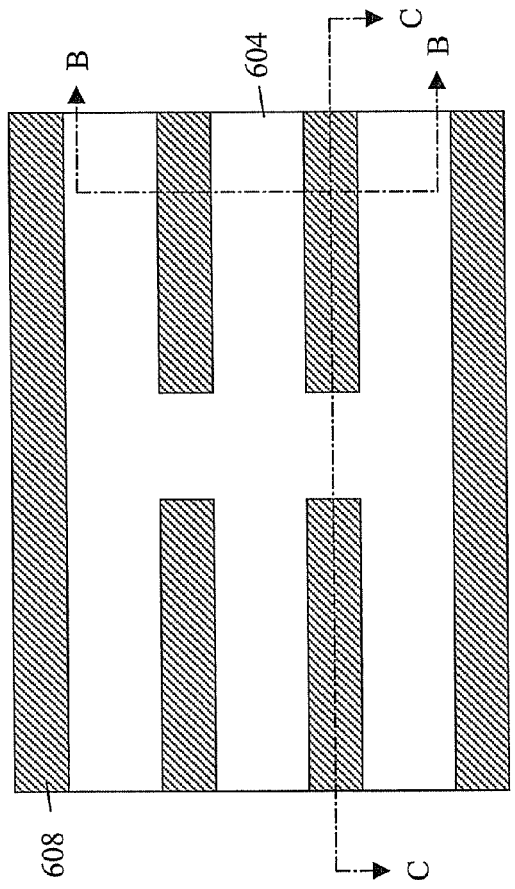
Figure 12C:
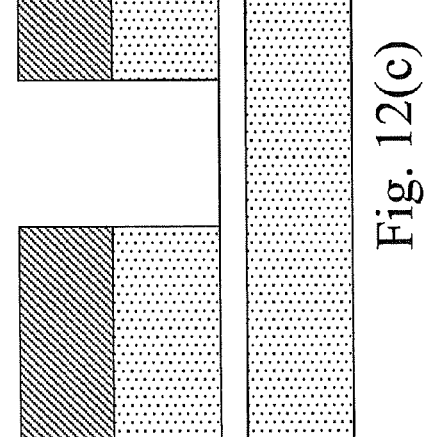
Figure 12B:
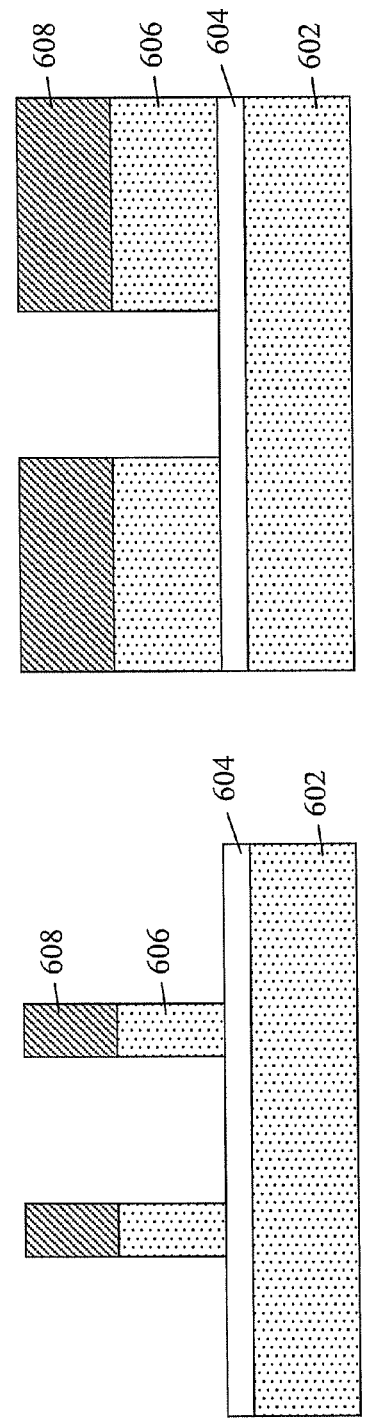

In FIGS. 10(a) and 10(b), the resulting double pattern is revealed in the planar hardmask layer upon removal of the second photoresist layer, specifically depicting the doped regions 612 in the hardmask layer 608 resulting from a double exposure, double dopant process. At this point, the hardmask layer 608 may now be patterned topographically with the desired gate pattern through a selective etch process that removes the doped regions 612, as shown in FIGS. 11(a) and 11(b). In one embodiment, the hardmask layer 608 comprises silicon nitride while the dopant species is germanium. The selective etch process for removing the doped regions 612 includes performing an etch process in a solution comprising hydrofluoric (HF) acid. Thereafter, the pattern of the hardmask layer 608 is then transferred into the gate conductor 606, through another etch process, stopping on the gate dielectric layer 604 as shown in FIGS. 12(a), 12(b) and 12(c). From this point, standard CMOS device processing may continue.

FIGS. 13 through 18 are a series of various top and cross sectional views illustrating a method of double patterning in semiconductor device manufacturing, in accordance with another embodiment of the invention. In this example, the non-topographic double patterning technique is applied in the formation of dense contacts, such as conductively filled vias within an interlevel dielectric (ILD) layer, used for making contact between transistor devices and a first wiring level, or between wiring levels in the back end of line (BEOL) regions of a semiconductor device, for example.

Figure 13A:
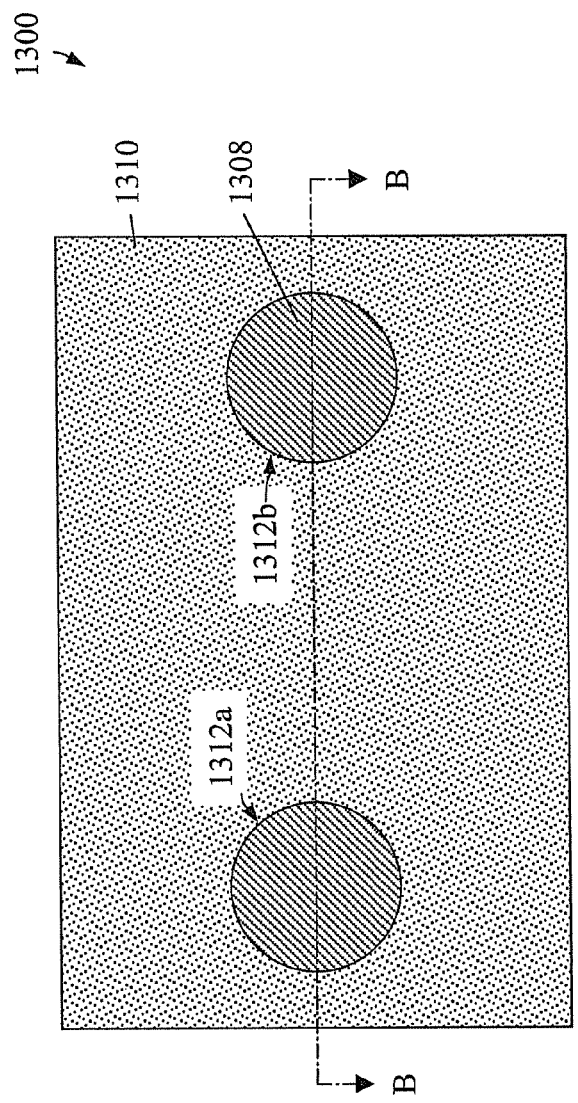
Figure 13B:
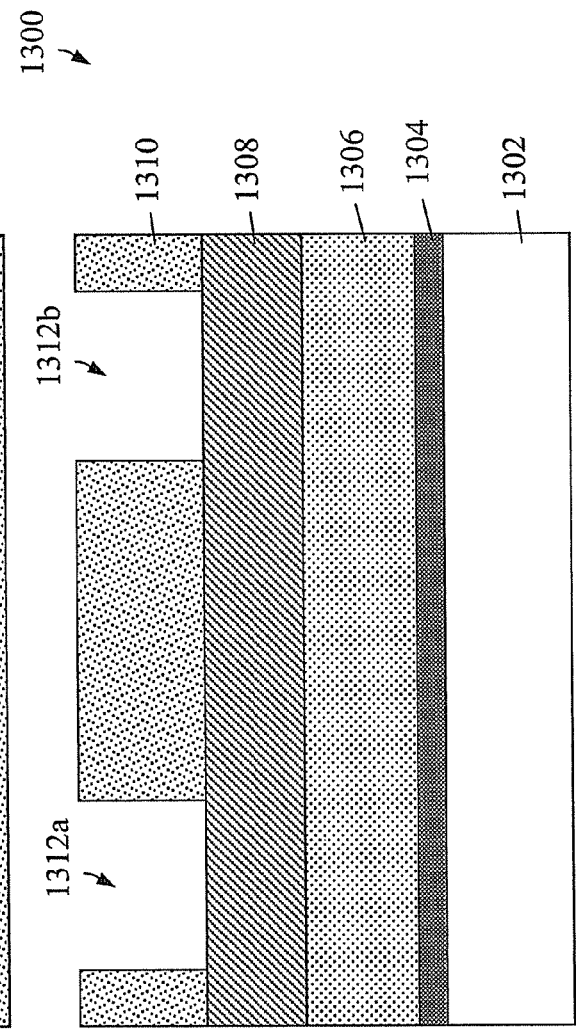

Beginning with FIGS. 13(a) and 13(b), a semiconductor device 1300 includes a semiconductor substrate 1302, a self aligned silicide (salicide) layer 1304 formed on the substrate 1302, an ILD layer 1306 formed on the salicide layer 604, and a hardmask layer 1308 formed on the ILD layer 1306. As also shown, a first photoresist layer 1310 formed on the hardmask layer 1308 is patterned with a first set of contact hole features or vias 1312a, 1312b. Conventionally, to pattern one or more additional vias between vias 1312a, 1312b, the resist pattern would first be etched into the hardmask layer 1308, followed by deposition of a second photoresist layer and a second patterning step to define subsequent contact holes. Instead, the device is subjected to a dopant implant (e.g., a neutral species such as germanium) as shown in FIGS. 14(a) and 14(b) so as to create doped regions 1314 within the hardmask layer 1308 that are etch selective with respect to undoped portions thereof. In this manner, the first pattern of contact holes is effectively registered or stored within the hardmask layer 1308 in a manner that does not create topography prior to completion of all desired contact holes. Once the first pattern is registered, the first resist layer 1310 is then removed.

Figures 15A, 15B:
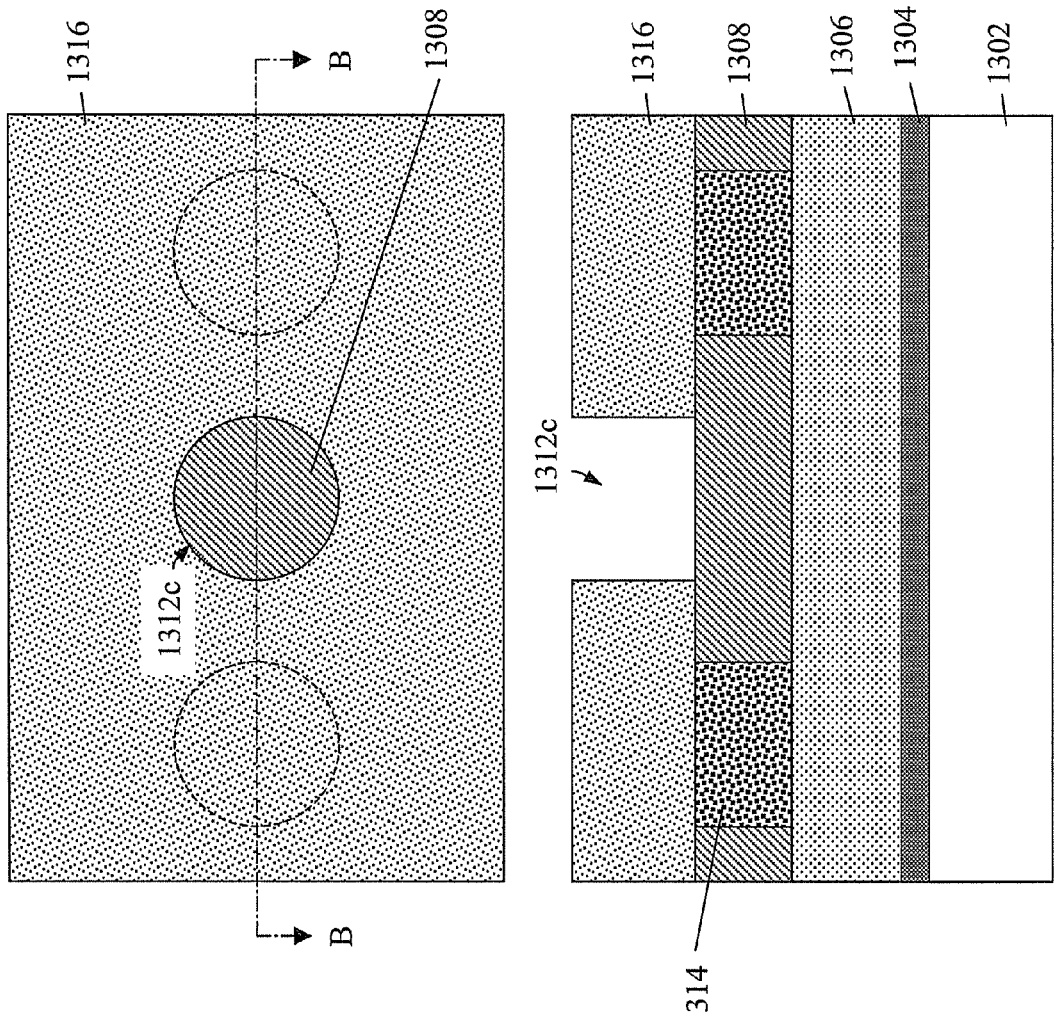
Figure 16A:
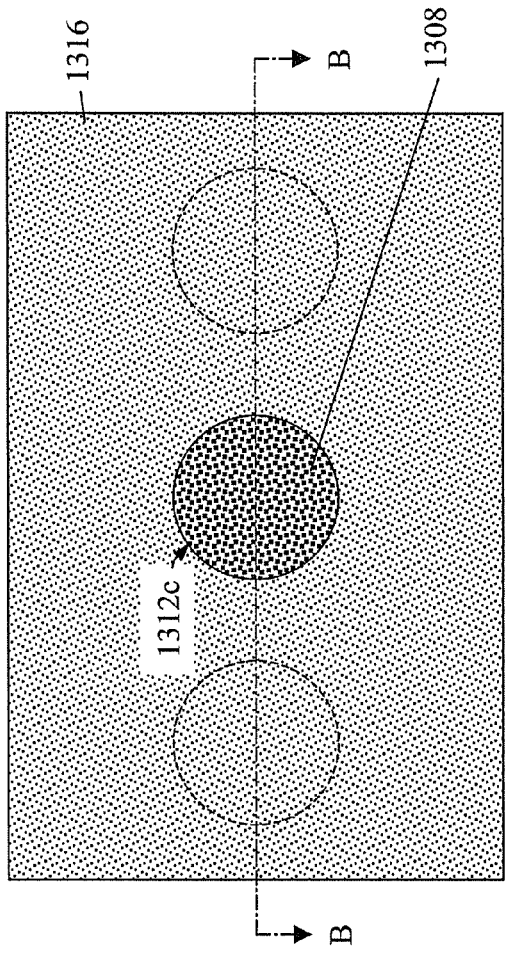
Figure 16B:
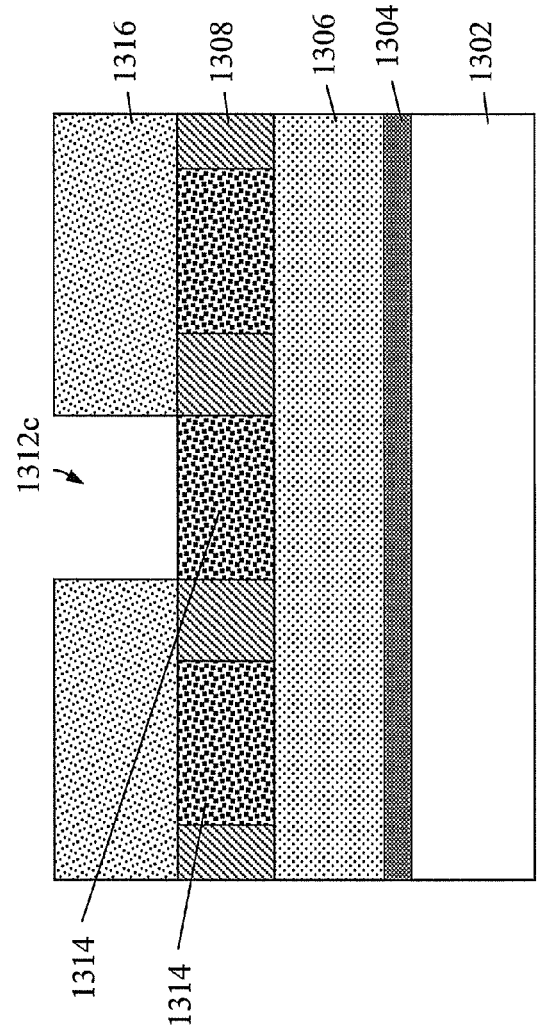
Figure 17A:
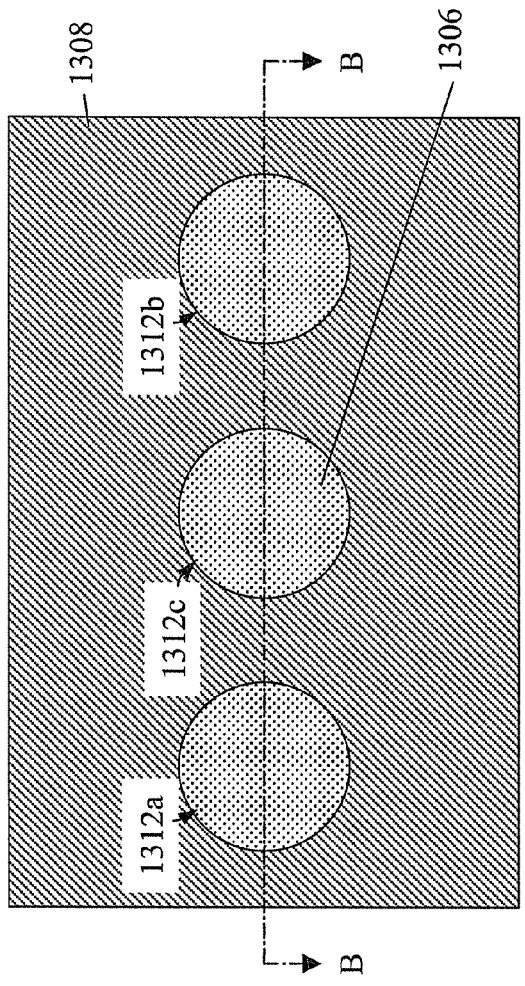
Figure 17B:
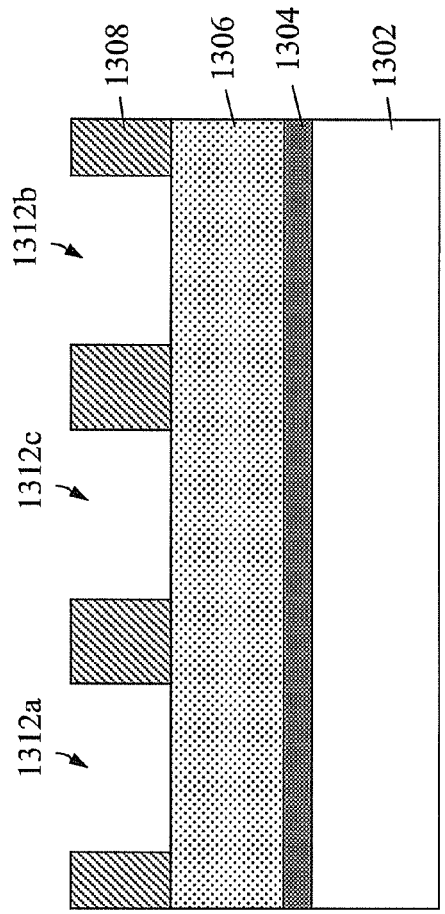
Figure 18A:
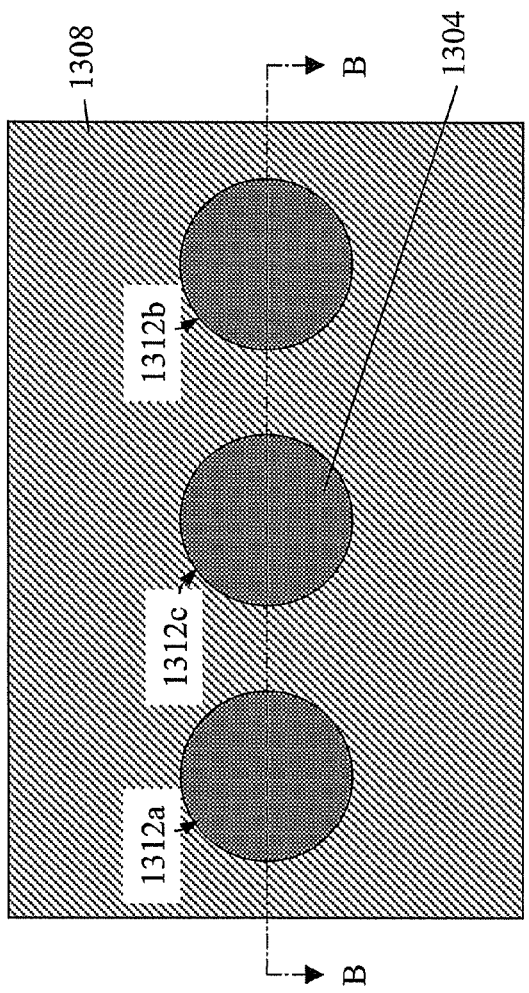
Figure 18B:
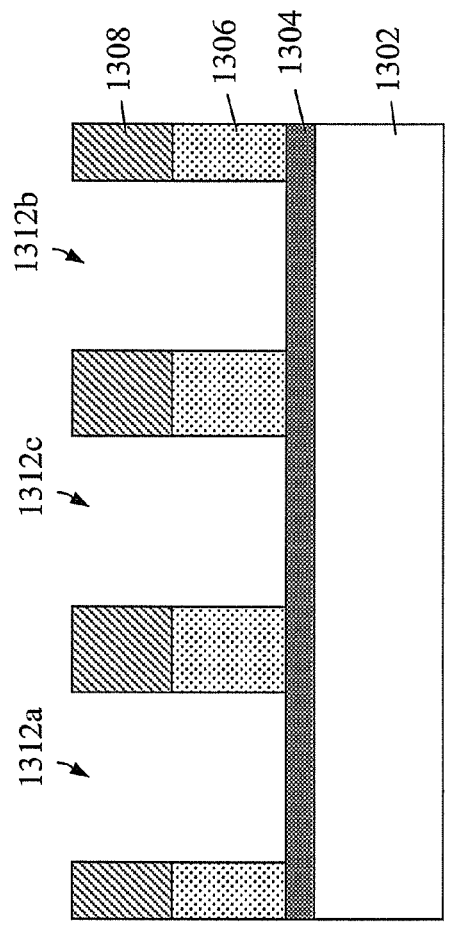

As shown in FIGS. 15(a) and 15(b), a second photoresist layer 1316 is then formed over the substantially planar, non-topographic hardmask layer 1308 with doped regions 1314. The resist layer 1316 is then patterned and opened to form another via opening 1312c, disposed between previously formed openings 1312a, 1312b, in order to increase the density of the vias. Then, a second dopant implant is performed so as register this second via pattern within the newly exposed portions of the planar hardmask layer 1308, as shown in FIGS. 16(a) and 16(b). Thereafter, the second photoresist layer 1316 is removed, followed by a selective etch process that removes the doped regions 1314, as shown in FIGS. 17(a) and 17(b). The combined via pattern etched into the hardmask layer 1308 is then transferred into the ILD layer 1306, through another etch process, stopping on the salicide layer 1304 as shown in FIGS. 18(a) and 18(b). From this point, standard damascene processing (e.g., liner, metal fill, chemical mechanical polishing, etc.) may continue.

Figure 19A:
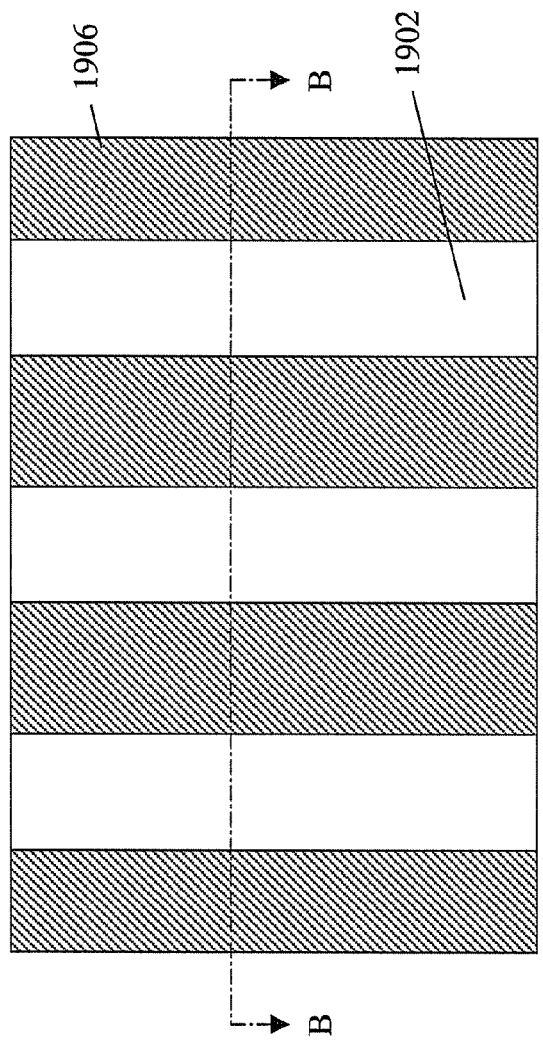
FIG. 19 is a pair of top and cross sectional views illustrating a method of double patterning in semiconductor device manufacturing, in accordance with another embodiment of the invention.
Figure 19B:
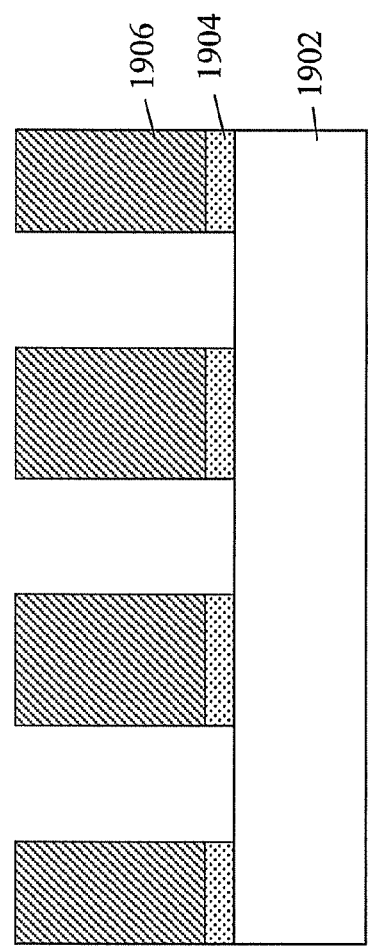

Finally, FIGS. 19(a) and 19(b) are, respectively, top and cross sectional views illustrating another example of a semiconductor structure that may be formed using the above described double patterning technique, in accordance with another embodiment of the invention. As the double pattern/double dopant implant/single etch sequence is adequately described above, the detailed sequence is omitted. Rather, FIGS. 19(a) and 19(b) depict still another example of a semiconductor device structure that may be formed through such a technique. Here, the example depicts the formation of double density shallow trench isolation (STI) structures that (as known in the art) are used to electrically isolate neighboring transistor devices and the like from one another. As is shown, a substrate 1902 has a pad oxide layer 1904 and a pad nitride layer 1906 formed thereon. A plurality of trench patterns 1908a, 1908b, 1908c are defined (through the above described technique) in the pad nitride and oxide layers 1906, 1904 to be transferred into the substrate 1902 and subsequently filled with an STI fill material, such as an oxide.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming an integrated circuit (IC) device feature, the method comprising:
    forming an initially substantially planar hardmask layer over a semiconductor device layer to be patterned;
    forming a first photoresist layer over the initially substantially planar hardmask layer, and patterning a first set of semiconductor device features in the first photoresist layer;
    registering the first set of semiconductor device features in the hardmask layer in a manner that maintains the hardmask layer substantially planar;
    removing the first photoresist layer;
    forming a second photoresist layer over the substantially planar hardmask layer, and patterning a second set of semiconductor device features in the second photoresist layer;
    registering the second set of semiconductor device features in the hardmask layer in a manner that maintains the hardmask layer substantially planar;
    removing the second photoresist layer; and
    creating topography within the hardmask layer by removing portions thereof corresponding to both the first and second sets of semiconductor device features.

2. The method of claim 1, wherein registering the first and second sets of semiconductor device features comprises subjecting exposed portions of the initially substantially planar hardmask to a dopant species that creates an etch selectivity within the hardmask layer.

3. The method of claim 2, wherein the dopant species comprises one or more of germanium, silicon, argon, xenon, and arsenic.

4. The method of claim 2, wherein creating topography within the hardmask layer comprises a selective etch to remove doped portions of the hardmask layer.

5. A method of forming an integrated circuit (IC) device feature, the method comprising:
    forming an initially substantially planar hardmask layer over a semiconductor device layer to be patterned;
    forming a first photoresist layer over the initially substantially planar hardmask layer, and patterning a first set of semiconductor device features in the first photoresist layer;
    registering the first set of semiconductor device features in the hardmask layer in a manner that maintains the hardmask layer substantially planar;
    removing the first photoresist layer;
    forming a second photoresist layer over the substantially planar hardmask layer, and patterning a second set of semiconductor device features in the second photoresist layer;
    registering the second set of semiconductor device features in the hardmask layer in a manner that maintains the hardmask layer substantially planar;
    removing the second photoresist layer;
    creating topography within the hardmask layer by removing portions thereof corresponding to both the first and second sets of semiconductor device features; and
    transferring a resulting combined pattern formed in the hardmask layer into the semiconductor device layer therebeneath.

6. The method of claim 5, wherein registering the first and second sets of semiconductor device features comprises subjecting exposed portions of the initially substantially planar hardmask to a dopant species that creates an etch selectivity within the hardmask layer.

7. The method of claim 5, wherein the dopant species comprises one or more of germanium, silicon, argon, xenon, and arsenic.

8. The method of claim 5, wherein creating topography within the hardmask layer comprises a selective etch to remove doped portions of the hardmask layer.

9. The method of claim 5, wherein the semiconductor device layer comprises a gate conductor layer.

10. The method of claim 9, wherein the first set of semiconductor device features comprises a plurality of gate conductor lines and the set of semiconductor device features comprises one or more regions where one or more the plurality of gate conductors are broken.

11. The method of claim 5, wherein the semiconductor device layer comprises an interlevel dielectric (ILD) layer.

12. The method of claim 11, wherein the first set of semiconductor device features comprises a plurality of contact vias and the second set of semiconductor device features comprises one or additional contact vias located between individual ones of the plurality of contact vias.

13. The method of claim 5, wherein the semiconductor device layer comprises a semiconductor substrate.

14. The method of claim 13, wherein the first set of semiconductor device features comprises a plurality of shallow trench isolation (STI) regions and the second set of semiconductor device features comprises one or additional STI regions located between individual ones of the plurality of STI regions.

* * * * *